United States Patent
Knudsen

(10) Patent No.: US 6,373,423 B1
(45) Date of Patent: Apr. 16, 2002

(54) FLASH ANALOG-TO-DIGITAL CONVERSION SYSTEM AND METHOD WITH REDUCED COMPARATORS

(75) Inventor: Niels Knudsen, Hunlebeek (DK)

(73) Assignee: National Instruments Corporation, Austin, TX (US)

( * ) Notice: Subject to any disclaimer, the term of this patent is extended or adjusted under 35 U.S.C. 154(b) by 0 days.

(21) Appl. No.: 09/461,173

(22) Filed: Dec. 14, 1999

(51) Int. Cl.⁷ ............................................... H03M 1/36
(52) U.S. Cl. ...................................... 341/159; 341/160
(58) Field of Search ................................. 341/118, 120, 341/61, 143, 155, 156, 163; 340/347

(56) References Cited

U.S. PATENT DOCUMENTS

| | | | |
|---|---|---|---|
| 3,803,590 A | * 4/1974 | Pastoriza | 340/347 |
| 3,908,181 A | * 9/1975 | Shigaki et al. | 340/347 |
| 3,955,101 A | * 5/1976 | Amelio et al. | 307/235 |
| 4,987,417 A | * 1/1991 | Buckland | 341/159 |
| 5,173,698 A | 12/1992 | Gulczynski | 341/158 |
| 5,214,430 A | 5/1993 | Gulczynski | 341/120 |
| 5,384,569 A | 1/1995 | Komatsu | 341/159 |
| 5,420,587 A | * 5/1995 | Michel | 341/156 |
| 5,463,395 A | * 10/1995 | Sawai | 341/156 |
| 5,581,255 A | * 12/1996 | Hsu | 341/156 |
| 5,623,265 A | 4/1997 | Pawar et al. | 341/160 |
| 5,721,503 A | 2/1998 | Burns et al. | 327/199 |
| 5,818,379 A | 10/1998 | Kim | 341/159 |
| 5,889,487 A | 3/1999 | Burns et al. | 341/159 |
| 6,011,503 A | 1/2000 | Lee | 341/159 |
| 6,072,416 A | 6/2000 | Shima | 341/159 |
| 6,127,959 A | 10/2000 | An | 341/156 |

* cited by examiner

Primary Examiner—Michael Tokar
Assistant Examiner—Joseph Lauture
(74) Attorney, Agent, or Firm—Conley, Rose & Tayon PC; Jeffrey C. Hood

(57) ABSTRACT

A flash A/D conversion system and method with a reduced number of comparators. The voltage range applied by the comparators is moved or adjusted to provide an A/D converter with a much greater voltage range. The system comprises a reduced plurality of comparators each coupled to receive an analog input signal, and a decoder coupled to receive the outputs of the comparators. Each comparator also receives a respective comparator reference signal for comparison with the analog input signal, and outputs a digital value indicative of the comparison between the analog input signal and the respective comparator reference signal. In one embodiment, a dynamic reference controller dynamically outputs one or more dynamic reference voltages to the plurality of comparators, wherein the comparators may receive different comparator reference voltages for comparing with the analog input signal. The dynamic reference controller thus may provide a sliding range voltage window for use in the analog-to-digital conversion process, wherein the input signal is maintained within the voltage window. In another embodiment, a feedback signal is used to reduce the voltage range of the analog input signal, thereby enabling a reduced number of comparators.

40 Claims, 9 Drawing Sheets

FLASH ANALOG-TO-DIGITAL CONVERSION SYSTEM AND METHOD WITH REDUCED COMPARATORS

BACKGROUND OF THE INVENTION

1. Field of the Invention

This invention relates to flash analog-to-digital converters that use a plurality of comparators in performing analog to digital conversion.

2. Description of the Related Art

Analog-to-digital conversion is used to interface a system using analog signals capable of continuous variation to an electronic system using discrete digital signals. The reverse operation of digital-to-analog conversion may also be used.

FIG. 1 illustrates an embodiment of a typical prior art parallel analog-to-digital converter (ADC) 100, also known as a flash converter. An analog input voltage signal (INPUT) 105 is input to a plurality of comparators 115. Generally, a large number of comparators are used, such as 256 comparators. A reference voltage signal (REF) 110 is also input to the plurality of comparators 115 through a voltage divider tree that includes a plurality of resistors 111 coupled between the reference signal 110 and ground 112. As shown, the positive input of each comparator 115 is the input signal 105, and the negative input of each comparator 115 is a comparator reference signal with a voltage between REF 110 and ground 112. The reference signal 110 applied to the negative input of each comparator 115 supplies a different comparator reference voltage according to the voltage divider tree.

The output of each comparator 115 is typically input to a latch 120. The output of each comparator 115 is stored in the respective latch 120 upon a rising edge of the clock signal (CLK) 125. The collective outputs of the comparators 115, stored in the latches 120, make up a thermometer code output 130. The thermometer code 130 is input to a decoder 135, sometimes referred to as an encoder. The decoder 135 decodes the thermometer code 130 into a multiple bit output 140. The output 140 is a digital value corresponding to the input analog signal 105.

A thermometer code 130 is typically a binary string of numbers, one binary value per comparator 115. Assigning the convention of most significant bit (MSB) on the left and least significant bit (LSB) on the right, i.e. MSB to LSB, the thermometer code 130 represents the binary output string of the plurality of comparators 115. The MSB is taken from the comparison between the input signal 105 and the reference signal 110. The LSB is taken from the comparison between the input signal 105 and the ground 112. In the thermometer code 130, each successive digit of the code changes from a "0" to a "1" as the value of the thermometer code increases. Assuming a simplified example with seven comparators, the thermometer code and the decoded output 140 could be any one of the following:

| Index | Thermometer Code | Decode |
|---|---|---|
| A | 0000000 | 000 |
| B | 0000001 | 001 |
| C | 0000011 | 010 |
| D | 0000111 | 011 |
| E | 0001111 | 100 |
| F | 0011111 | 101 |
| G | 0111111 | 110 |
| H | 1111111 | 111 |
| all other | | unknown |

Note that thermometer code A signifies an input signal 105 that is below one-seventh of the reference signal 110. Thermometer code B signifies an input signal 105 that is above one-seventh of the reference signal 110 but below two-sevenths of the reference signal 110. Thermometer code H signifies an input signal 105 that is above the reference signal 110.

By convention, most ADCs 100 output the decode of thermometer code H as an error code since the output of the comparators 115 is other than an accepted value for a thermometer code 130. Any value above the reference signal 110 is unmeasurable, i.e. there is no way to know how far that the input signal is above the reference signal 110. An output that is not a proper thermometer code 130 is called a sparkle code, glitch or glitch error, or a misconversion error. For example, if the output of the comparators 115 were 0001011, then the decoder 135 would output an unknown code.

The reason for the error code output is that decoders 135 typically only look for the single transition from a "0" to a "1" in the thermometer code 130. If two or more transitions occur, the decoder 135 cannot properly decode the thermometer code 130, and hence the decoder 135 may output an incorrect or erroneous code. Incorrect thermometer codes may result from signal propagation delays in the circuit. For example, the output of the comparators 115 may be latched by the latches 120 at slightly different times, allowing for one latch 120F to latch a "one" while latch 120G latches a "zero".

As described above, a flash A to D converter has a large number of comparators, and each comparator is typically required to compare the input voltage with a reference voltage that is very close to its neighboring comparator. When a flash A/D converter is implemented in silicon, additional problems can arise. In a silicon implementation, the flash A/D converter must have good resolution and low offset, meaning that the error in neighboring comparators should not compound to create sparkle codes. Also, the large number of comparators result in a large amount of chip space, power consumption and noise. Further, since it is necessary to drive the input of all of the comparators, low impedance results, as well as high frequency noise due to the capacitance of the comparators.

Therefore, an improved flash analog to digital converter is desired which provides good resolution while also using a reduced number of comparators.

SUMMARY OF THE INVENTION

The present invention comprises a flash analog-to-digital conversion system and method with a reduced number of comparators. The present invention may provide good resolution with reduced chip space and power requirements, as well as reduced noise and capacitance problems.

The system comprises a reduced plurality of comparators each coupled to receive an analog input signal, and a decoder coupled to receive the outputs of the comparators. Each comparator also receives a respective comparator reference signal for comparison with the analog input signal. Each comparator is configured to output a digital value indicative of the comparison between the analog input signal and the respective comparator reference signal. The decoder is configured to output a digital representation (a digital output signal) of the analog input signal based on the result.

In one embodiment, the analog-to-digital converter includes a dynamic reference controller coupled to the first plurality of comparators and the decoder. The dynamic reference controller is configured to dynamically output one or more dynamic reference voltages to the first plurality of comparators, wherein the first plurality of comparators are operable to dynamically receive different comparator reference voltages for comparing with the analog input signal. The dynamic reference controller is operable to dynamically change the dynamic reference voltage signal(s) to provide a sliding range voltage window for use in the analog-to-digital conversion process. The dynamic reference controller may adjust only the upper voltage or lower voltage of the sliding range voltage window to grow or shrink the window, or may adjust both the upper and lower voltages to move the sliding range voltage window within the larger range of the A/D converter. The dynamic reference controller may use the input signal, the digital output signal, or a combination of both to dynamically change the dynamic reference voltage signal(s). The dynamic reference controller preferably maintains the sliding range voltage window such that the input signal is within the voltage window. The dynamic reference controller provides information regarding the sliding range voltage window to the decoder, and the decoder uses this information to adjust the digital output accordingly.

A method for performing analog-to-digital conversion is also contemplated. In one embodiment, the method includes receiving an analog signal and comparing the analog signal with a plurality of comparator reference signals to form a thermometer code representative of the analog signal. The method uses a reduced number of comparators. The method may also include dynamically adjusting the reference voltage window used by the comparators, based on the magnitude of the input signal, output signal, or both. The thermometer code is decoded, and a reference value that corresponds to dynamic adjustments of the plurality of reference signals is added to the decode of the thermometer code to produce a scaled digital decode of the thermometer code. The plurality of dynamic reference signals are dynamically adjusted, and the scaled digital decode corresponds to the analog signal.

In another embodiment, the analog-to-digital converter includes a subtracting node which receives an analog input signal and a feedback signal to produce a combined analog signal, a first plurality of comparators each coupled to receive the combined analog signal, a digital summer coupled to receive the outputs of the plurality of comparators, a register coupled to receive the digital signal from the digital summer and produce a digital output, and a digital-to-analog (D/A) converter coupled to receive the digital output and produce the feedback signal. The combined analog signal is the analog input signal minus the analog feedback signal. Each comparator is further coupled to receive a respective reference signal for comparison with the combined analog signal. The plurality of comparators are each further configured to output a digital value indicative of the comparison of the combined analog signal with the respective reference signal. Due to the analog feedback signal applied to the analog input signal, the combined analog signal input to the comparators has a much smaller voltage range. Thus, a lesser number of comparators may be used. The digital summer is configured to output a digital signal representative of the analog input signal. The register is configured to store the digital signal from the digital summer as a stored value and output the stored value as a digital output corresponding to the analog input signal. The D/A converter is configured to output the analog feedback signal indicative of the digital output. The digital summer is further coupled to receive the digital output and combine or add the digital output with the outputs of the plurality of comparators, thereby generating a final digital output corresponding to the analog input signal. A method for performing analog-to-digital conversion according to this alternate embodiment is also contemplated.

Thus, in the above embodiments, the analog input signal has a value within a first voltage range, and the analog-to-digital converter system and method performs analog to digital conversion on the analog input signal within the first voltage range. However, the plurality of comparators operate to compare the analog input signal with the plurality of reference signals using a second voltage range which is less, typically much less, than the first voltage range. For example, the second voltage range used by the plurality of comparators may be less than one half, one fourth, or one eighth, or even less, than the first possible voltage range of the input analog signal.

BRIEF DESCRIPTION OF THE DRAWINGS

Other objects and advantages of the invention will become apparent upon reading the following detailed description and upon reference to the accompanying drawings in which.

Figure 1:
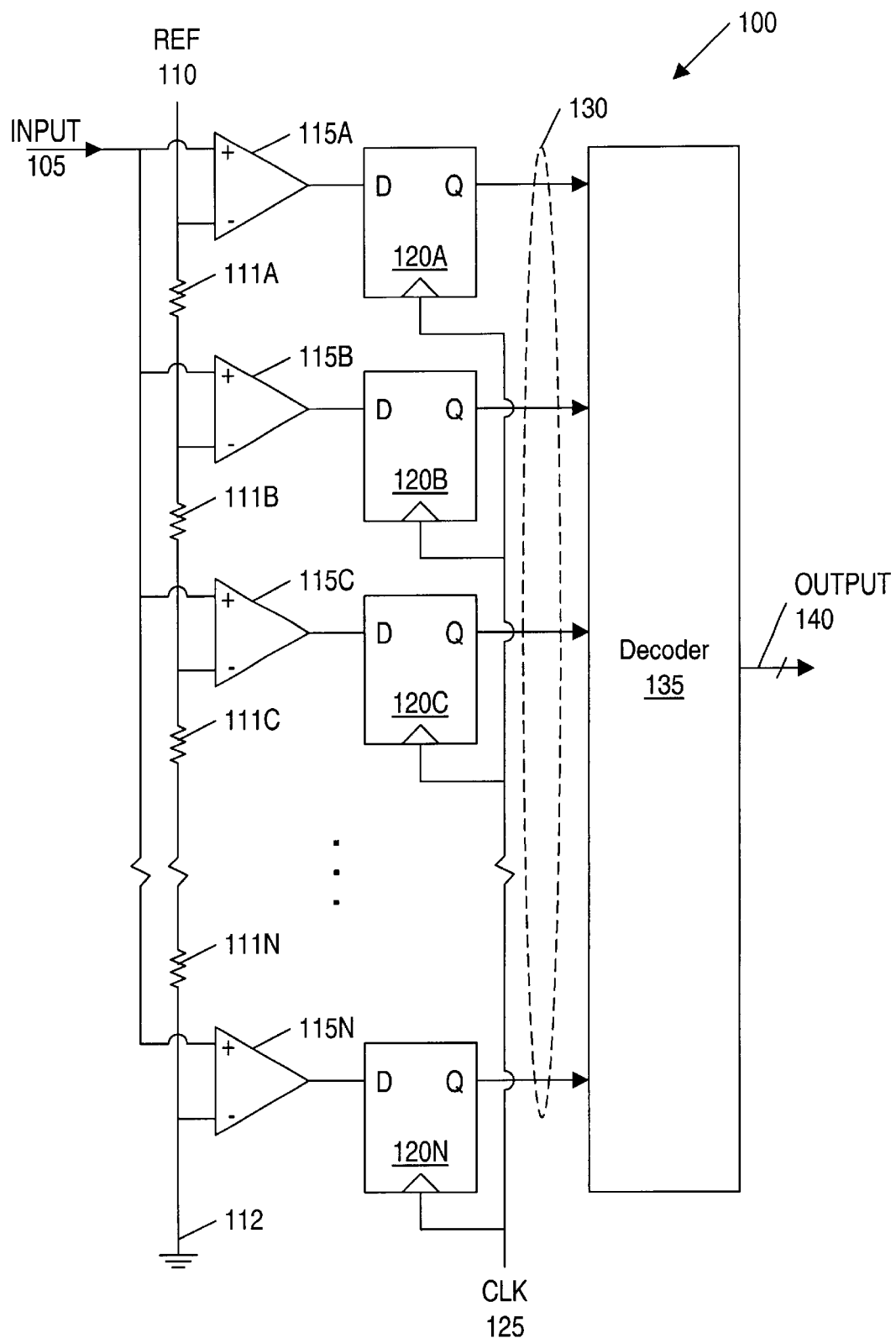
FIG. 1 is a block diagram of an embodiment of a prior art parallel analog-to-digital converter.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Figure 2A:
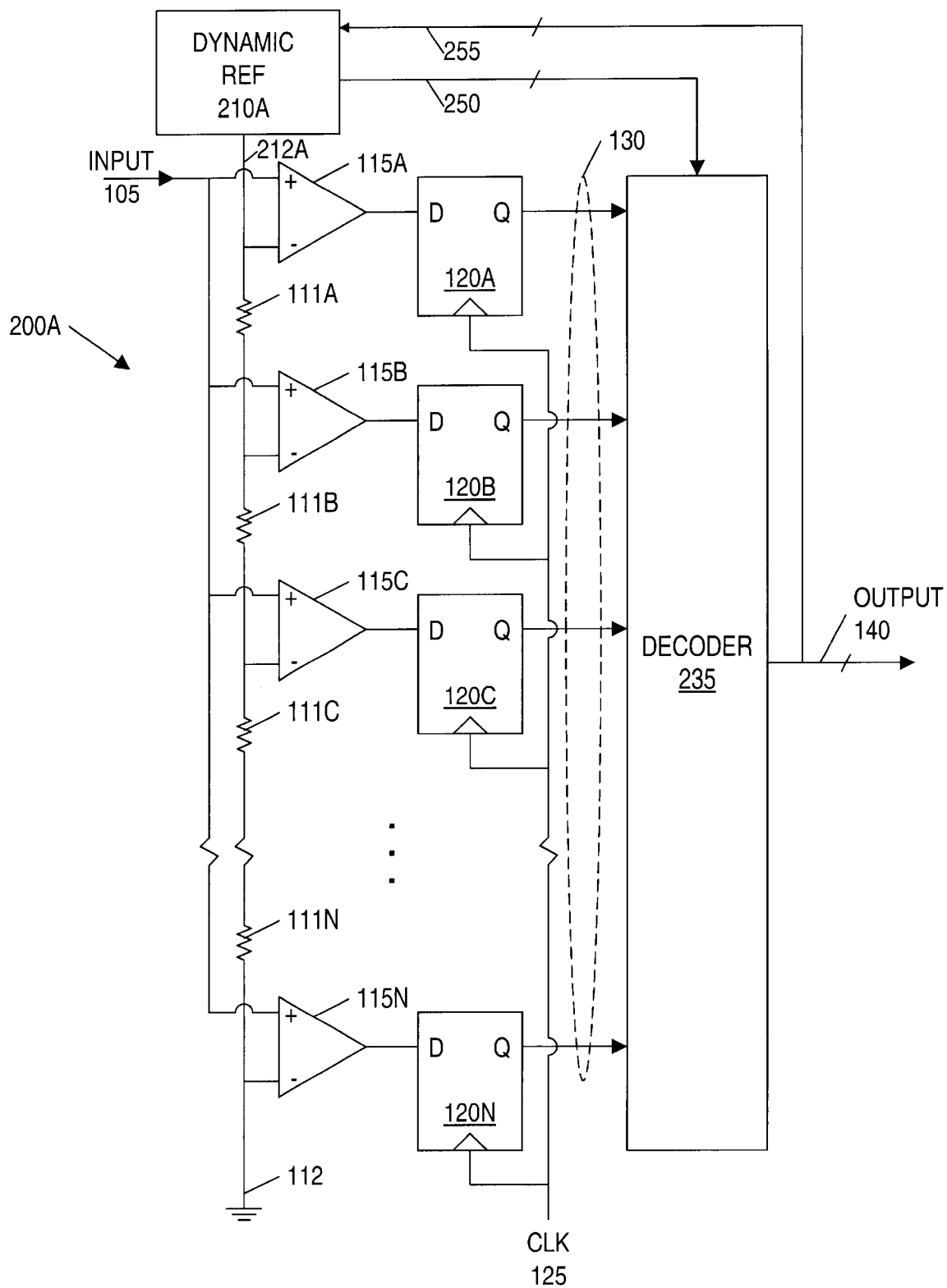
FIG. 2A is a block diagram of an embodiment of parallel analog-to-digital converter according to one aspect of the present invention.
Figure 2B:
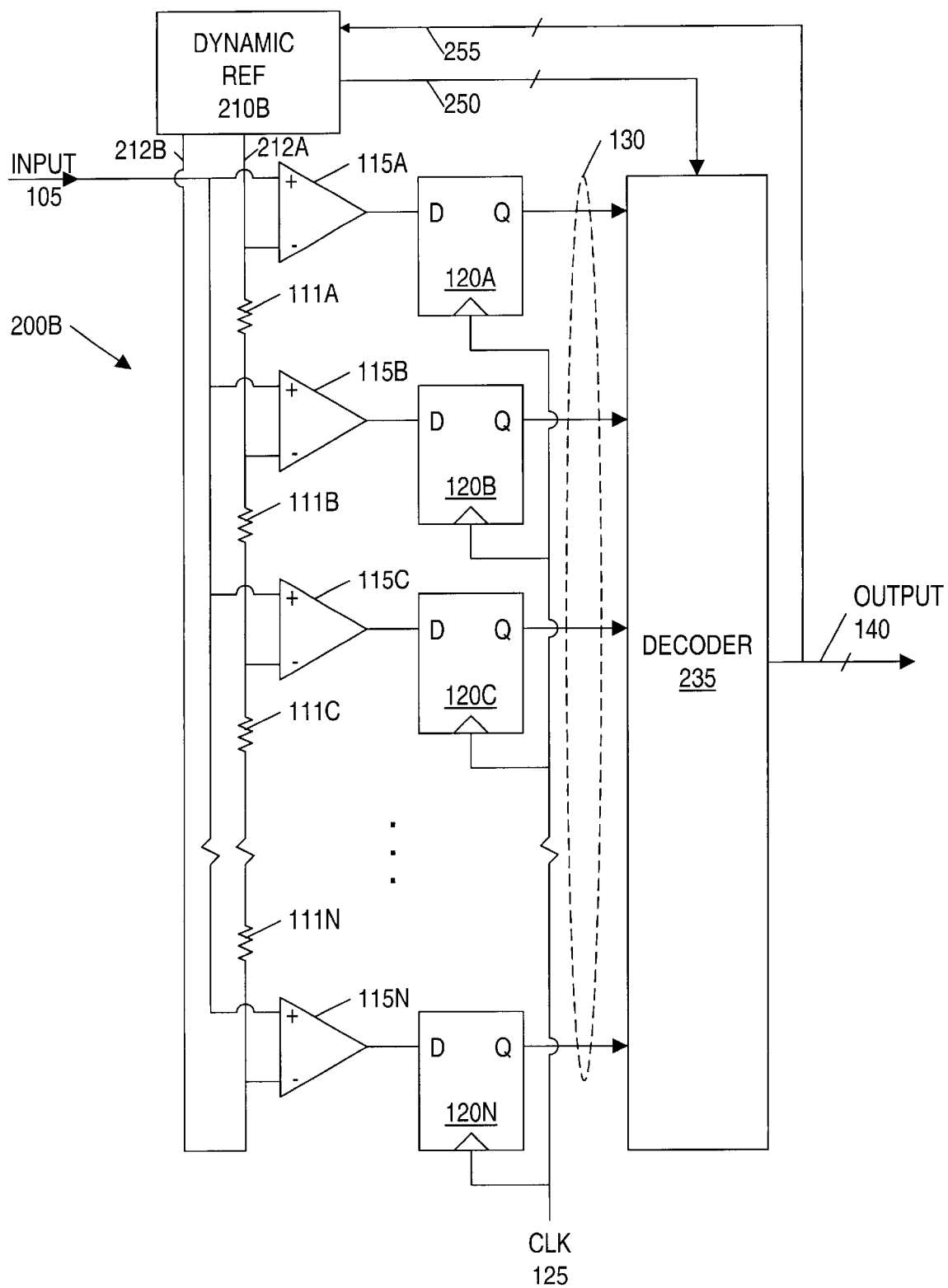
FIG. 2B is a block diagram of another embodiment of parallel analog-to-digital converter according to one aspect of the present invention.
Figure 2C:
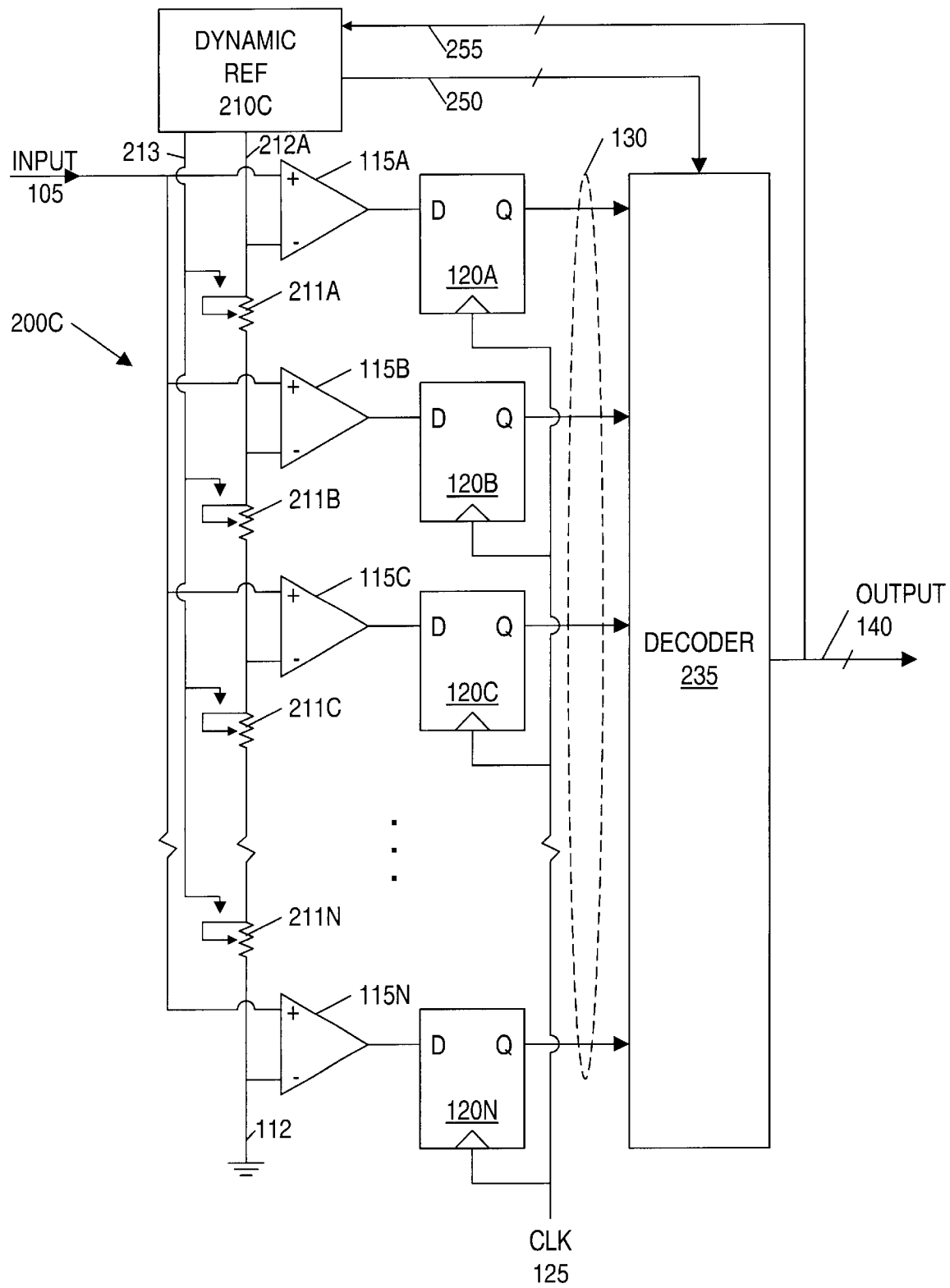
FIG. 2C is a block diagram of yet another embodiment of parallel analog-to-digital converter according to one aspect of the present invention.

FIGS. 2A, 2B, and 2C

FIG. 2A illustrates one embodiment of a parallel analog-to-digital converter (ADC) 200A with a reduced number of comparators according to one aspect of the present invention. For example, the parallel ADC 200A may include 32 comparators 115 that are used to implement the functionality of an ADC with a much larger number of comparators, such as 128 or 256 comparators.

As shown, an analog input voltage signal (INPUT) 105 is input to a plurality of comparators 115. A dynamic reference voltage block 210A provides a dynamic reference voltage signal 212A as an input to the plurality of comparators 115 through a voltage divider tree. The dynamic reference voltage block 210A also may receive the digital output 140 of the decoder 235 as a feedback signal 255 and may use the digital output 140 in determining the dynamic reference voltage signal 212A for a subsequent input signal 105. The dynamic reference voltage block 210A is configured to accept the feedback signal 255 as an indication of a voltage to expect as the input signal 105 on a next, or subsequent, clock cycle. The dynamic reference voltage block 210A is operable to dynamically change the dynamic reference voltage signal 212A in response to changes in the digital output 140. The dynamic reference voltage block 210A is also configured to output the dynamic reference voltage signal 212A to the decoder 235 using signal 250, wherein the decoder 235 may use the dynamic reference voltage signal 212A to adjust or scale the result of the decoded thermometer code 130.

The voltage divider tree includes a plurality of resistors 111 coupled between the reference signal 212A and ground 112. As shown, the positive input of each comparator 115 is the input signal 105, and the negative input of each comparator 115 is a comparator reference signal with a value between the reference signal 212A and ground 112, inclusive. The dynamic reference signal 212A applied to the negative input of each comparator 115 supplies a different comparator reference voltage according to the voltage divider tree.

Figure 3A:
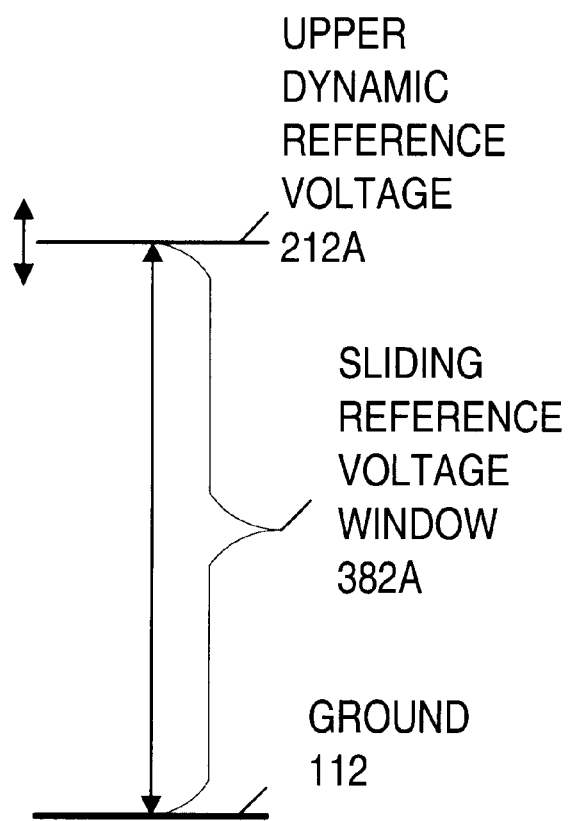
FIGS. 3A and 3B are diagrams of embodiments of the sliding reference voltage windows according to one aspect of the present invention.

The voltage range of the voltage divider tree may be referred to as the sliding voltage range window. The sliding voltage range window may be a subset of the total reference voltage range offered by the A/D converter 200A. In the embodiment of FIG. 2A, the voltage divider tree ranges from ground to the voltage 212A output from the dynamic reference voltage block 210A. Thus, in this embodiment, only the upper value of the sliding voltage range window is adjustable. The sliding range voltage window of the embodiment of FIG. 2A is shown in FIG. 3A. In another embodiment, only the lower value of the sliding range voltage window may be adjustable, or both values may be adjustable, as described in the embodiment of FIG. 2B.

In this embodiment of the present invention, the reference voltage block 210A is dynamically operable to change the dynamic reference voltage signal 212A being provided to the plurality of comparators 115 through the voltage divider tree, thus essentially providing the sliding voltage range window for use in performing analog to digital conversion on the input analog signal 105. The reference voltage block 210A dynamically adjusts the sliding voltage range window of the voltage divider tree to ensure that the current input analog signal value 105 falls within the voltage range window.

When a first analog input value is received, it can be presumed that the next value will be fairly close in the neighborhood to that first value. The present invention essentially uses a smaller number of comparators 115 and "moves them around", i.e., dynamically changes the sliding voltage range window, so that the comparators 115 perform comparisons using different comparator reference voltages for some of the input values. As the output voltage changes its magnitude, the dynamic reference controller 210A adjusts the sliding voltage range window accordingly to maintain the analog input value 105 within the sliding voltage range window.

The present invention uses the fact that the total reference voltage range is not necessary at all times, but rather only a portion of the total reference voltage range (the sliding voltage range window) may be necessary at any given time. Thus, a smaller group of comparators 115 can be re-used for various input values, thereby reducing the number of comparators 115 to be implemented in silicon, and as a result reducing the associated cost, power consumption, and die space, etc.

The output of each comparator 115 may be input to a latch 120. The output of each comparator 115 is stored in the respective latch 120 upon a rising edge of the clock signal (CLK) 125. The collective outputs of the comparators 115, from the latches 120, are called a thermometer code output 130. The thermometer code 130 is input to a decoder 235, according to one aspect of the present invention. The decoder 235 also receives an output 250 from the reference voltage block 210A. The thermometer code 130 is decoded by the decoder 235. In one embodiment, the decoder 235 is the adder decoder described in co-pending U.S. patent application Ser. No. 09/351,758, entitled "Analog-to-Digital Conversion System and Method with Reduced Sparkle Codes", hereby incorporated by reference in its entirety.

The decoder 235 may use the output 250 from the reference voltage block 210A to determine the proper reference point for the thermometer code output 130. As an example, consider an ADC 200A with 32 comparators configured to operate over a total reference voltage range of 1–10 V. At fall range, i.e., with the dynamic reference voltage 212A set to 10.00 V by the reference voltage block 210A, the voltage width for each comparator 115 is [10.00 V/31=]0.323 V. As used herein, "voltage width" refers, in the absence of errors or sparkle codes, to the voltage range or difference detectable by each individual comparator.

When the input voltage is changing slowly, the reference voltage block 210A may operate to lower the dynamic reference voltage 212A to a level where the voltage width for each comparator 115 is smaller. For example, consider a previous clock cycle where the input voltage 105 was measured at 3.00 V. The next clock cycle, the reference voltage block 210A dynamically adjusts the dynamic reference voltage 212A to 5.00 V. This allows the ADC 200A to have a voltage width for each comparator 115 of [5.00 V/31=]0.161 V. Thus, the ADC 200A now has an effective resolution that is twice the default resolution. In a preferred embodiment, the reference voltage 212A is adjusted each clock cycle.

Continuing the example, the decoder 235 receives a thermometer code of 00000000000000001111111111111111 [15 zeroes and 17 ones]. The decoder 235 is operable to output a digital value with as many bits of resolution as desired, not limited by the number of comparators 115. The decoder 235 has received a value that is greater than [17/31*5.00 V=]2.74 V and less than [18/31*5.00 V=]2.90 V. The decoder 235 is operable to output a digital value indicative of the range 2.74 V–2.90 V, as desired. If ADC 200A has a 256-bit digital output, encoded to eight bits, with voltage width values of [10.00 V/255=]0.0392 V, then the digital output would be 01000111, corresponding to a value of [(2.74+2.90)/2/0.0392=71.91=]71. It is noted that in other embodiments, values such as 70–73 may be output. For example, an output value of 70 would result from the calculation 2.74/0.0392.

FIG. 2B illustrates another embodiment of a parallel analog-to-digital converter (ADC) 200B with a reduced number of comparators according to one aspect of the present invention. The primary difference between the embodiment of FIG. 2B and between the embodiment of FIG. 2A is that, in the embodiment of FIG. 2B, the dynamic reference voltage block 210B outputs two reference voltage signals 212A and 212B. Thus, in the embodiment of FIG. 2B, the sliding voltage range window slides or moves within the larger range of the A/D converter 200B, as shown in FIG. 3B.

Figure 3B:
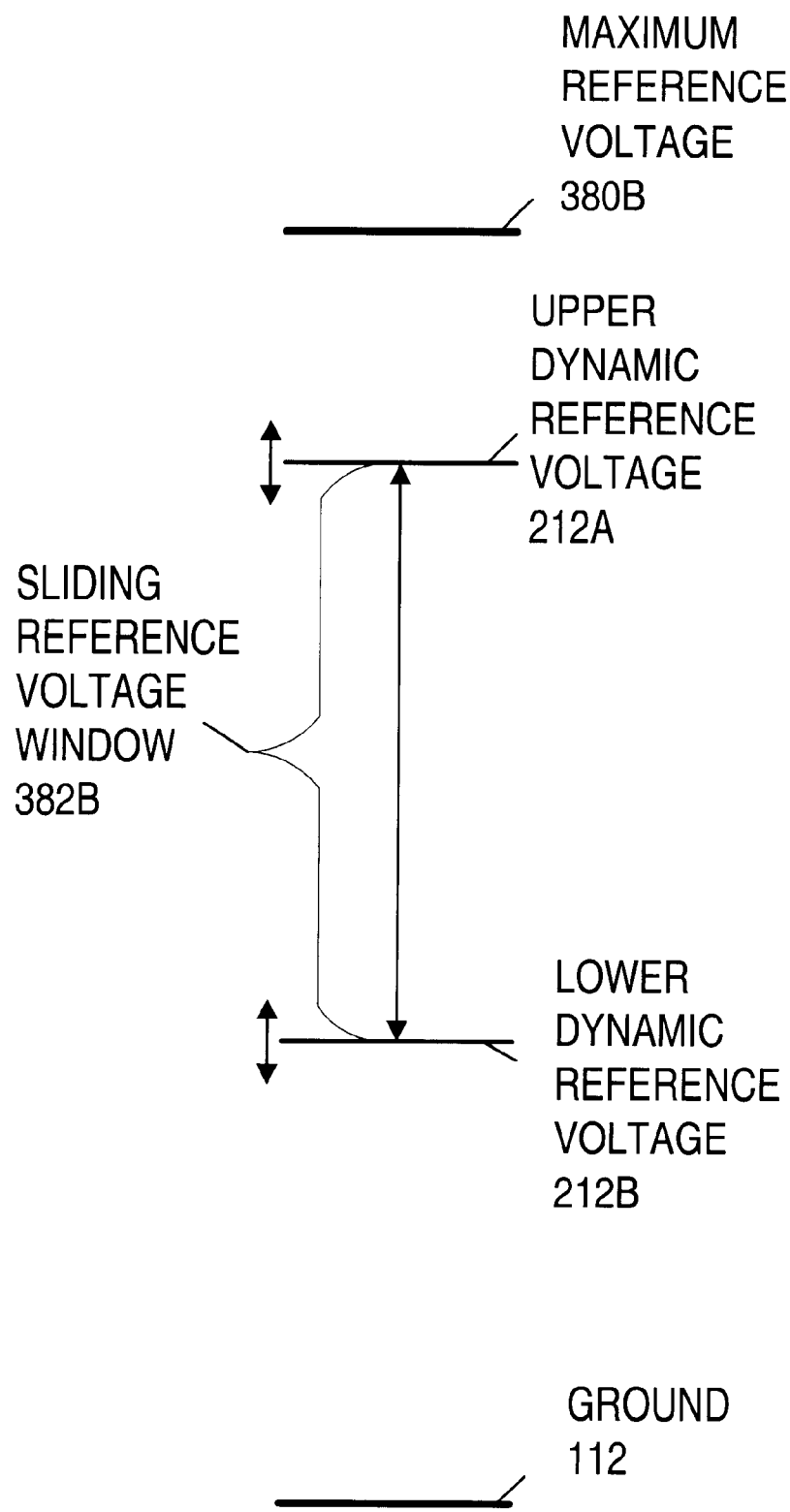

As shown in FIG. 3B, the dynamic reference voltage block 210B provides dynamic reference voltage signals 212A and 212B as high and low inputs to the plurality of comparators 115 through the voltage divider tree. The dynamic reference voltage block 2101B may also be configured to output the dynamic reference voltage signals 212A and 212B to the decoder 235 in signal 250 to enable the decoder 235 to adjust the result of decoding the thermometer code 130. The dynamic reference voltage block 210B is operable to dynamically change the dynamic reference voltage signals 212A and 212B in response to changes in the feedback signal 255.

The voltage divider tree includes a plurality of resistors 111 coupled between high dynamic reference signal 212A and low dynamic reference signal 212B. As shown, the positive input of each comparator 115 is the input signal 105, and the negative input of each comparator 115 is a comparator reference signal between high dynamic reference signal 212A and low dynamic reference signal 212B. The dynamic reference signals 212A and 212B supplied to the negative input of each comparator 115 supply a variable and different comparator voltage according to the voltage divider tree.

In this embodiment of the present invention, the reference voltage block 210B is dynamically operable to change the dynamic reference voltage signals 212A and 212B being provided to the plurality of comparators 115 through the voltage divider tree. The reference voltage block 210 dynamically changes the dynamic reference voltage signals 212A and 212B, thus essentially providing a sliding voltage range window for use in performing analog to digital conversion on the input analog signal 105. The reference voltage block 210B dynamically adjusts the sliding voltage range window of the voltage divider tree to ensure that the input analog signal 105 falls within the voltage range window.

In addition, the reference voltage block 210B may adjust the width of the sliding voltage range window based on the degree or amount of change in the input signal 105. Thus, if the input signal 105 is changing slowly, the width of the sliding voltage range window may be smaller, providing a greater resolution with little risk that the input signal 105 will have an abrupt change between clock cycles and fall outside of the sliding voltage range window. If the input signal 105 is changing magnitudes rapidly or abruptly, the width of the sliding voltage range window may be increased to ensure that the input signal 105 stays within the sliding voltage range window on successive clock cycles.

The decoder 235 uses the output 250 from the dynamic reference voltage block 210B to determine the proper reference point for the thermometer code output 130. As an example, consider an ADC 200B with 32 comparators configured to operate over a total reference voltage range of 1–10 V. At full range, i.e., with the reference voltage 212A set to 10.00 V and the reference voltage 212B set to 0.00 V by the dynamic reference voltage block 210, the voltage width for each comparator 115 is [10.00 V/31=]0.323 V.

As discussed above, if the input signal 105 is sampled and is found to be changing slowly, the dynamic reference voltage block 210B may change both the high dynamic reference voltage 212A and the low dynamic reference voltage 212B to shorten the sliding voltage range window, wherein the voltage width for each comparator 115 is smaller. The sliding voltage range window may also be adjusted or moved so that the input voltage 105 is approximately centered within the sliding voltage range window. For example, consider that in the previous clock cycle the input voltage 105 was measured at 3.00 V. This clock cycle, the dynamic reference voltage block 210 adjusts the high dynamic reference voltage 212A to 5.00 V and the low dynamic reference voltage to 1.00 V. This allows the ADC 200B to have a voltage width for each comparator 115 of [(5.00 V–1.00 V)/31=]0.129 V. Thus, the ADC 200B now has an effective resolution that is much greater than the default resolution. In a preferred embodiment, the dynamic reference voltages 212A and 212B are adjusted each clock cycle.

Continuing the example, the decoder 235 receives a thermometer code of 00000000000000011111111111111111 [15 zeros and 17 ones]. The decoder 235 is operable to output a digital value with as many bits as desired, not limited by the number of comparators 115. In this example, the ADC 200B outputs 128 bits encoded to seven bits. The decoder 235 has received a value that is greater than [(17/31*(5.00 V–1.00 V))+1.00 V=]3.19 V and less than [(18/31*(5.00V–1.00 V))+1.00 V=]3.32 V. The decoder 235 is operable to output a digital output signal with a value indicative of the range 3.19 V–3.32 V, as desired. For the 128-bit output, ADC 200B outputs 0101000, corresponding to a value of [3.19/10.00*127=]40.

FIG. 2C illustrates another embodiment of a parallel analog-to-digital converter (ADC) 200C with a reduced number of comparators according to one aspect of the present invention. In the embodiment of FIG. 2C, the negative input of each comparator 105 is a comparator reference signal between reference signal 212A and ground 112. A primary difference between the embodiment of FIG. 2C and the embodiments of FIGS. 2A and 2B is that the sliding range voltage window of the embodiment of FIG. 2C may have variable width divisions on a respective comparison, while the embodiments of FIGS. 2A and 2B have uniform width divisions for a respective comparison. (It is noted that the embodiments of FIGS. 2A and 2B may adjust the size of the width divisions for different comparisons by adjusting the size of the window as discussed above.).

The embodiment of FIG. 2C is similar to the embodiment of FIG. 2A, except that a second set of control signals 213 are output from the dynamic reference voltage block 210C to the plurality of variable resistors 211 in the voltage divider tree. The dynamic reference voltage block 210C is configured to output the dynamic reference voltage signal 212A and the voltage divider signals 213 to the decoder 235 in signal 250 to enable the decoder to scale the result of decoding the thermometer code 130. The dynamic reference voltage block 210C is operable to dynamically operable to change the dynamic reference voltage signal 212A and/or the voltage divider signals 213 in response to changes in the feedback signal 255.

The voltage divider tree includes a plurality of variable resistors 211 between the dynamic reference voltage signal 212A and ground 112. As shown, the positive input of each comparator 115 is the input signal 105, and the negative input of each comparator 115 is a comparator reference signal between dynamic reference voltage signal 212A and ground 112. The dynamic reference voltage signal 212A applied to the negative input of each comparator 115 supplies a variable and different comparator voltage according to the voltage divider tree.

In this embodiment of the present invention, the dynamic reference voltage block 210C is dynamically operable to change the dynamic reference voltage signal 212A being provided to the plurality of comparators 115 through the voltage divider tree and the voltage divider signals 213 being provided to the plurality of variable resistors 211. Dynamically changing the dynamic reference voltage signal 212A and the voltage divider signals 213 dynamically changes the distribution of the dynamic reference voltage signal 212A, thus essentially providing a sliding and variable voltage range window for use in performing analog to digital conversion on the input analog signal 105. The dynamic reference voltage block 210C dynamically adjusts the size and shape of the sliding voltage range window of the voltage divider tree to ensure that the input analog signal 105 falls within a desired portion of the sliding voltage range window.

The decoder 235 uses the output 250 from the dynamic reference voltage block 210C to determine the proper reference point for the thermometer code output 130. As an example, consider an ADC 200B (from FIG. 2B) with 32 comparators configured to operate over a dynamic voltage range of 1–10 V. At full range, i.e., with the reference voltage 212A set to 10.00 V and the set to 0.00 V by the reference voltage block 210, the voltage width for each comparator 115, when the voltage divider signals 213 signal equal resistances with 11111111111111111111111111111111, is [10.00 V/31=]0.323 V.

Now compare the various voltage widths for ADC 200C of the embodiment of FIG. 2C for various comparators 115, when the voltage divider signal 213 signals differing resistances with 88666444222211111112222244466688 (sum of digits=118). Comparators 115A–115B and 115EE–115FF each have a voltage width of [10.00 V*8/118=]0.678 V. Comparators 115C–115E and 115BB–115DD each have a voltage width of [10.00 V*6/118=]0.508 V. Comparators 115F–115H and 115Y–115AA each have a voltage width of [10.00 V*4/118=]0.339 V. Comparators 115I–115M and 115T–115X each have a voltage width of [10.00 V*2/118 =]0.169 V. Finally, Comparators 115N–115S each have a voltage width of [10.00 V*1/118=]0.0847 V.

As the input voltage is sampled and is found to be changing slowly, the dynamic reference voltage block 210C is operable to change both the high dynamic reference voltage 212A and the voltage divider signals 213 to a level where the voltage width for appropriate comparators 115 is smaller, and the input voltage 105 is approximately centered. For example, consider that in the previous clock cycle the input voltage 105 was measured at 3.00 V. This clock cycle, the reference voltage block 210 adjusts the high reference voltage 212A to 5.00 V and the voltage divider signals 213 to 88888864422211111111112224446668. This allows the ADC 200C to have voltage widths for the comparators 115 of 0.328 V, 0.246 V, 0.164 V, 0.0820 V, and 0.0410 V, depending on the voltage divider signal 213 values of 8, 6, 4, 2, and 1, respectively. Thus, the ADC 200C now has an effective resolution in the region where the input signal 105 is expected that is much greater than the default resolution. In a preferred embodiment, the dynamic reference voltage 212A and voltage divider signals 213 are adjusted each clock cycle.

Continuing the example, the decoder 235 receives a thermometer code of 00000000000000011111111111111111 [15 zeroes and 17 ones]. The decoder 235 is operable to output a digital value with as many bits as desired, not limited by the number of comparators 115. In this example, 128 bits are output encoded to eight bits. The decoder 235 has received a value that is greater than [73/122*5.00 V=]2.99 V and less than [74/122*5.00 V=]3.03 V. The decoder 235 outputs a digital value of [2.99 V/10.00 V*225=]76, encoded to 01001100, indicative of the range 2.99 V–3.03 V.

It is noted that the embodiment of FIG. 2C can easily be modified to include a lower reference voltage 212B, or other feature included in other embodiments. The values for the voltage divider signals 213 are limited only by physical limitations of the signal lines or traces used to transmit the voltage divider signals 213 themselves.

FIGS. 3A and 3B

FIGS. 3A and 3B illustrate embodiments of the sliding voltage range windows, such as are used in the systems of FIGS. 2A and 2B. In FIG. 3A, the maximum reference voltage 380A produced by the dynamic reference voltage block 210 is shown at the top and ground 112 is shown at the bottom. The voltage range between ground 112 and the maximum reference voltage 380A represents the total reference voltage range of the A/D converter 200A. The upper dynamic reference voltage 212A value is shown as a controllable value that may range anywhere inside the limits of the maximum reference voltage 380A and ground 112, inclusive. The comparator reference voltage range 382A (i.e. the sliding reference voltage window) is shown as the region between the upper dynamic reference voltage 212A and ground 112, inclusive. In this embodiment, the comparator reference voltage range 382A is an expanding or shrinking voltage window with a dynamically changeable upper value and a fixed lower value.

In FIG. 3B, the maximum reference voltage 380B is again shown at the top and ground 112 is shown at the bottom. The upper dynamic reference voltage 212A value is shown as a controllable value that may range anywhere from a high of the maximum reference voltage 380A to a low that is greater than the lower dynamic reference voltage 212B value. The lower dynamic reference voltage 212B value is shown as a controllable value that may range anywhere below the upper dynamic reference voltage 212A down to ground 112. In this embodiment, the comparator reference voltage range 382B is a sliding reference voltage window with dynamically changeable upper and lower values. Thus, the sliding reference voltage window 382B moves within the larger voltage range of the A/D converter. As noted above, the width of the sliding reference voltage window 382B may be dynamically adjusted as well.

FIG. 4

Figure 4:
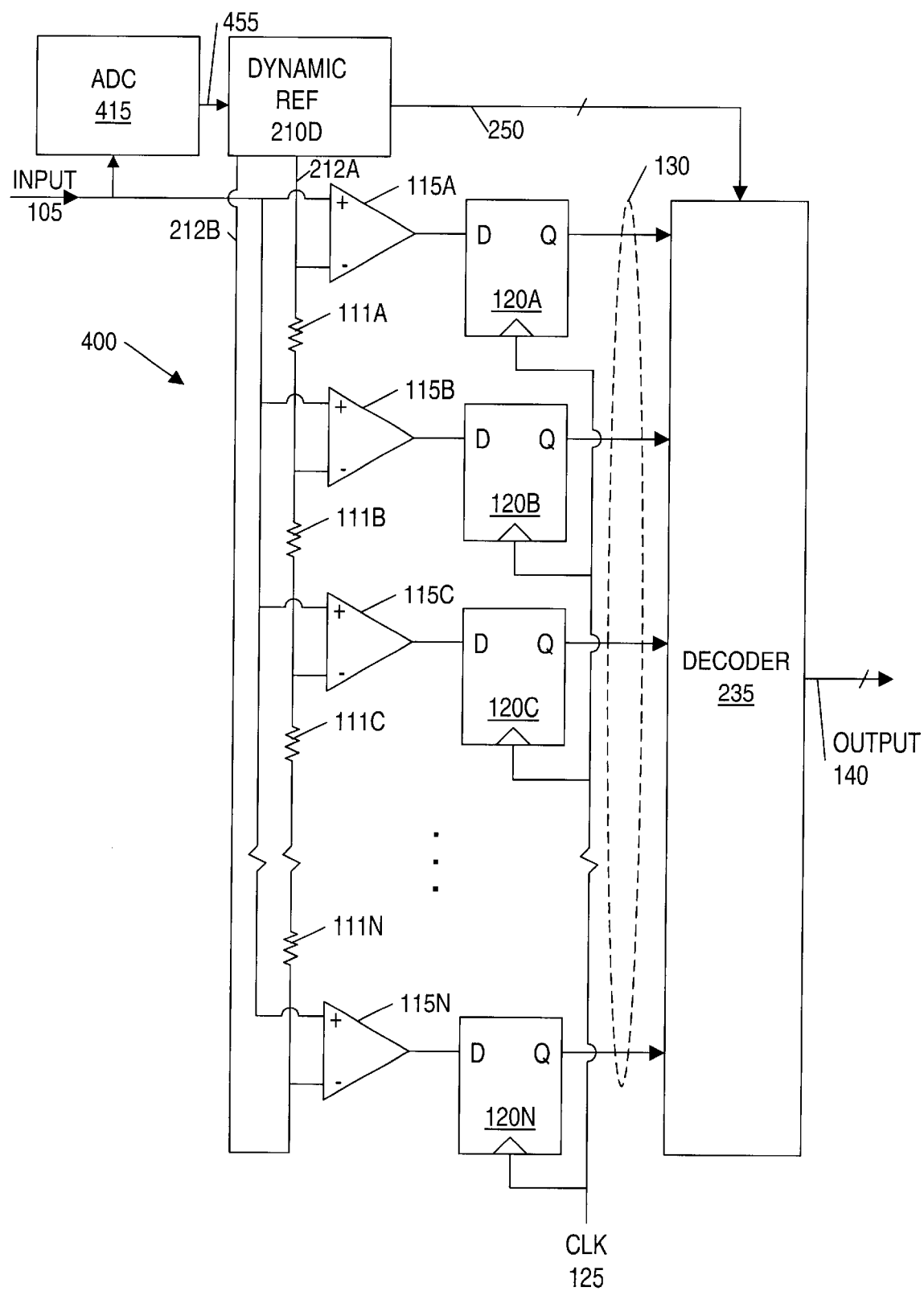
FIG. 4 is a block diagram of an alternative embodiment of a parallel analog-to-digital converter using feedforward according to one aspect of the present invention.

Although in the above embodiments the dynamic reference voltage block 210 uses the digital output 140 of the decoder 235 as a feedback signal, a feedforward method using the input signal 105 is also contemplated. FIG. 4 illustrates an analog-to-digital converter 400 using a feedforward method to dynamically change the dynamic reference voltage signals 212A and 212B, according to one aspect of the present invention. Note that the dynamic reference control block 210D is operable to receive a feedforward signal 455 indicative of the value of the input signal 105. The embodiment of FIG. 4 is similar to the embodiment of FIG. 2B, except that the input signal 105 is provided to an analog-to-digital converter (ADC) 415 and the digital output 455 from the ADC 415 is provided to the dynamic reference control block 210D to indicate the approximate value of the input signal 105 for the current clock cycle.

The dynamic reference voltage block 210B receives the feedforward signal 455 from ADC 415. The dynamic reference voltage block 210D is configured to accept the feedforward signal 455 as an indication of a voltage to expect as the input 105 during the present, or future, clock cycle. ADC 415 is preferably an inexpensive unit with a fast response time. Very little resolution is needed. The analog-to-digital converter 415 may be a sample and hold circuit, an integrating ADC, or other inexpensive ADC.

FIG. 5

Figure 5:
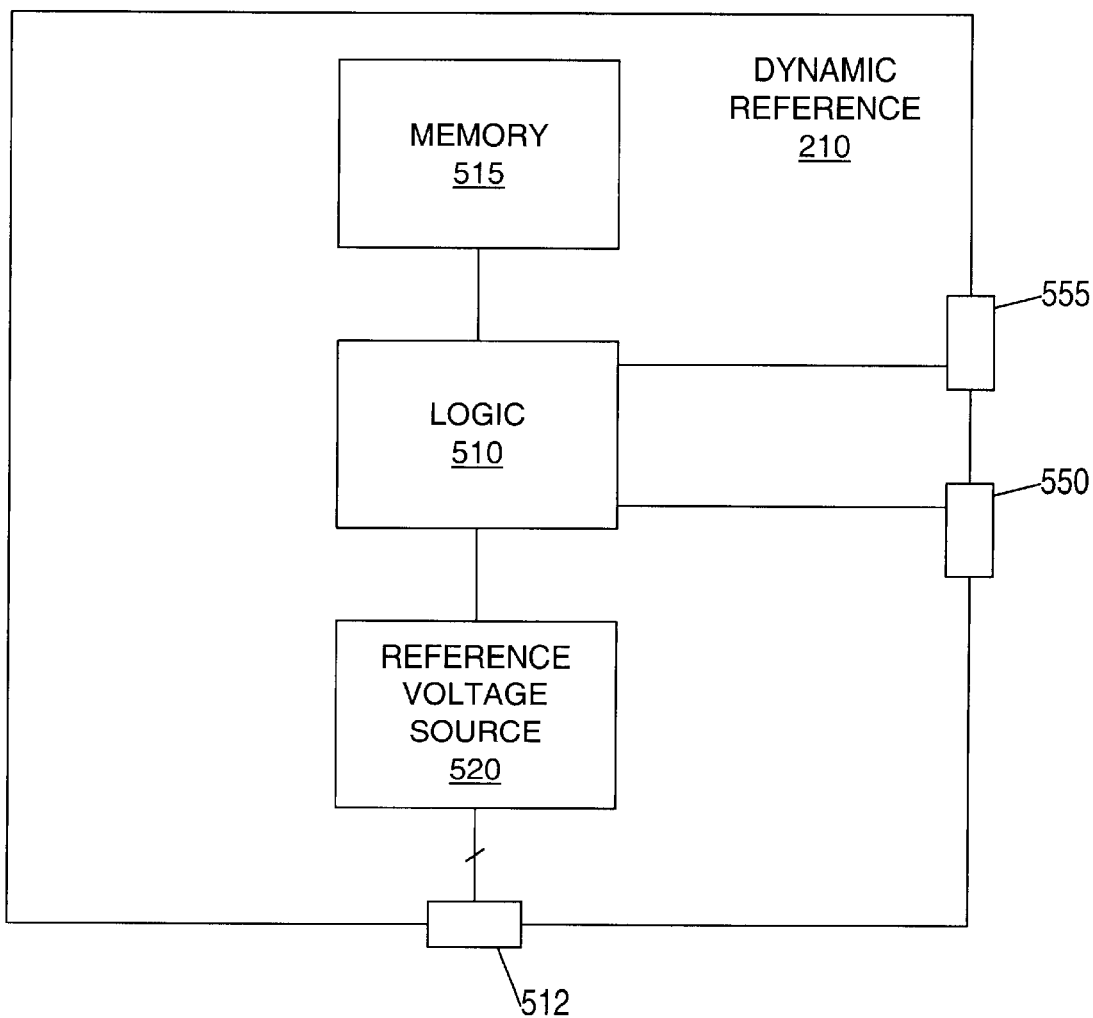
FIG. 5 is a block diagram of an embodiment of a dynamic reference voltage block according to one aspect of the present invention.

FIG. 5 illustrates an embodiment of a dynamic reference voltage block 210, such as is referred to in FIGS. 2A, 2B, 2C, and 4, above. The dynamic reference voltage block 210 includes logic 510, optional memory 515, a reference voltage source 520, and a plurality of input/output ports 512, 550, and 555. As illustrated, the logic 510 is coupled to the memory 515, the reference voltage source 520, input port 555, and output port 550. The reference voltage source 520 is also coupled to output port 512.

In various embodiments, the logic 510 is operable to control the dynamic reference voltage block 210. The logic 510 may be or include a processor (CPU), an embedded processor, digital signal processor (DSP), or microcontroller which executes instructions from the memory. The logic 510 may also comprise programmable logic, discrete logic, etc. The memory may also be used to hold a history of values for the feedforward signal 455, feedback signal 255, or the reference signals 212 and 213, as desired. By using the historical values or changes thereto, the dynamic reference block 210 may ignore one or more inputs or outputs before dynamically changing the dynamic reference signals 212 or 213. It is noted that a combination of feedback and feedforward may also be used. Such an embodiment could store histories of the feedforward signals 455 and the feedback signals 250, along with the reference voltage signals 212, 213, etc.

FIG. 6

Figure 6:
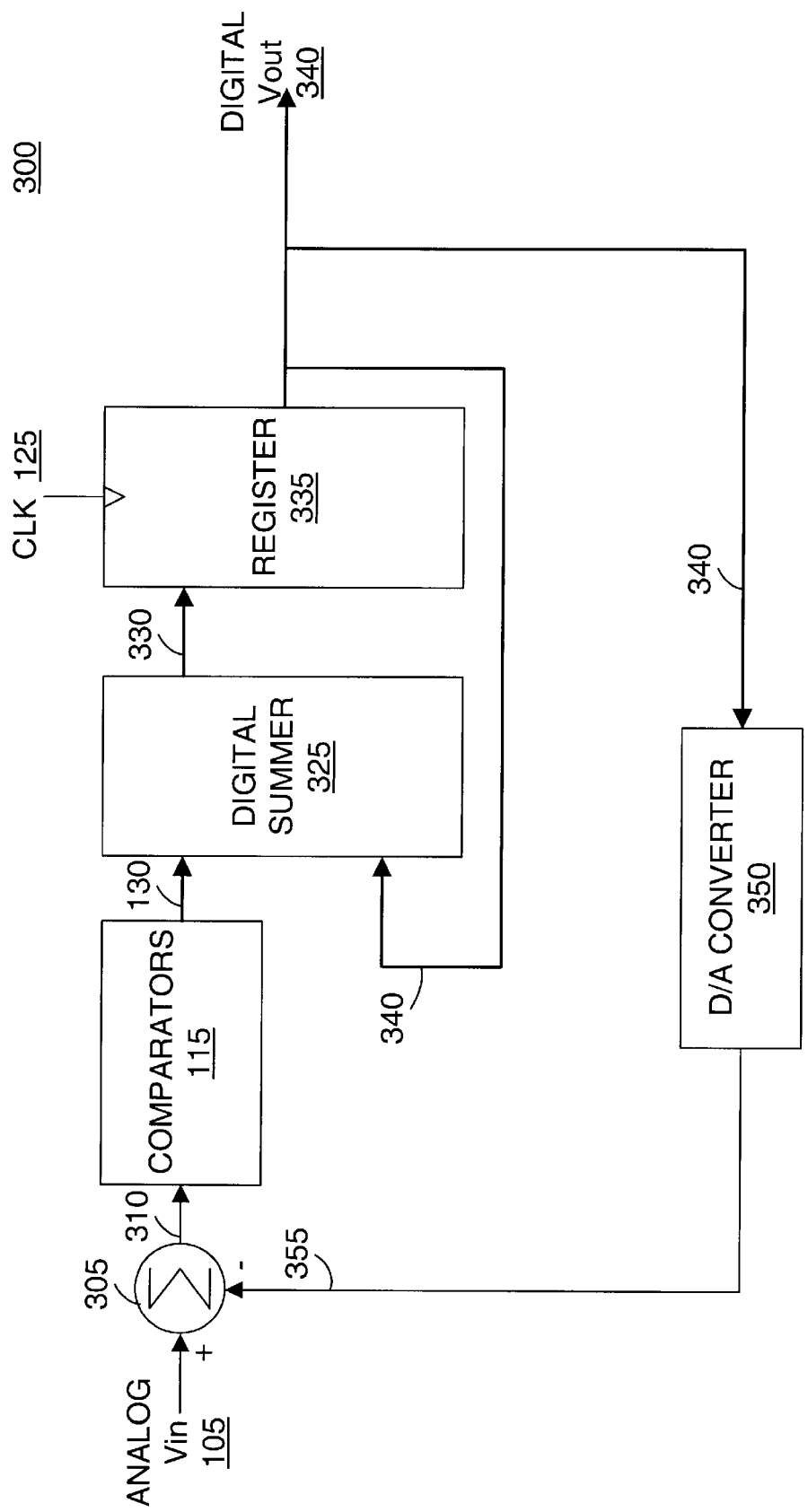
FIG. 6 is a block diagram of another embodiment of a parallel analog-to-digital converter according to one aspect of the present invention.

FIG. 6 illustrates an A/D converter 300 according to an alternate, and preferred, embodiment of the present invention. In this embodiment, instead of dynamically adjusting the reference voltage based on the input analog signal to create a sliding voltage window, the embodiment of FIG. 5 utilizes a feedback method to reduce the range of the input signal, thereby allowing a reduced number of comparators. In this embodiment, the voltage reference window is preferably constant. In the preferred embodiment, the voltage reference window is symmetrical, for example from −A to +A volts. However any window range, for example from +A to +B Volts, can be used as long as the comparators 115 generates signed numbers. For example, for the range +A to +B volts, the comparators would generate positive numbers when the voltage 310 is larger than (A+B)/2 Volts.

The A/D converter 300 includes an input summing junction 305 configured to accept an analog input signal 105 and subtract a feedback signal 355, thereby producing a combined analog signal 310, a plurality of comparators 115 coupled to accept the output 310 from the summing junction 305, a digital summer 325 coupled to accept the thermometer code output 130 of the comparators 115, and a register 335 coupled to the output 330 of the digital summer 325. The register 335 provides the digital output 340 of the A/D converter 300. The digital summer 325 essentially acts as a decoder. The digital summer 325 includes a first input which receives the thermometer code output 130 of the plurality of comparators 115, and a second input which receives the digital output 340, produced by the register 335 as a feedback signal. The digital output 340 produced by the register 335 is also provided to an input of a digital to analog (D/A) converter 350. The output 355 of the D/A converter 350 is provided as the feedback signal to the input summing junction 305.

The feedback signal 355 is subtracted from the analog input signal Vin. Thus, the combined analog signal 310 input to the comparator 115 has a smaller voltage range than the input signal Vin 105 due to the feedback signal. Thus, a lesser number of comparators 115 may be used in comparing the combined input signal than the input analog signal Vin. The digital summer 325 operates to add the output 130 of the comparators 115 and the prior digital output stored in the register 335 to produce the new final digital output Vout 340, which in effect re-compensates for the feedback signal applied to the analog input signal.

In this embodiment of the present invention, the feedback signal 355 is dynamically operable to change the input signal 310 to the comparators 115 through the summing junction 305. Thus, instead of changing one or more reference voltages to create a sliding range voltage window as described above, this system operates to reduce the range of the input signal using feedback to create a similar effect. Thus, the range of the combined signal 310 input to comparators 115 is much less than the range of the original input signal 105. This allows a reduced number of comparators in block 115. Thus, analog to digital conversion is performed on the analog signal 310 using a smaller number of comparators than would otherwise be needed if the comparators received the input voltage signal 105. The feedback essentially ensures that the input signal 310 falls within the voltage range window provided by the comparators 115.

It is noted that in one embodiment, the digital summer 325 may make use of the adder decoder described in co-pending U.S. patent application Ser. No. 09/351,758, to decode the thermometer code, prior to adding in the feedback signal 340 value. The feedback signal 340 is added back to the output 130 of the comparators 115 to compensate for the effect of the feedback signal 355 subtracted from the analog input $V_{in}$.

A method for performing analog-to-digital conversion according to this alternate embodiment is also contemplated. The method comprises first receiving an analog input signal. The analog input signal has a value within a first voltage range, wherein the method performs analog to digital conversion on the analog input signal within the first voltage range.

The method then subtracts a feedback signal from the analog input signal, thereby producing a combined analog signal. The combined analog signal has a much smaller dynamic range than the original analog input signal due to the feedback signal.

The method then compares the combined analog signal with a plurality of reference signals to form a thermometer code representative of the combined analog signal. This step uses a plurality of comparators to compare the combined analog signal with the plurality of reference signals.

The method then sums the thermometer code with a digital value to generate a digital output signal, wherein the digital output signal corresponds to the analog input signal.

The digital value preferably comprises a prior value of the digital output signal. In one embodiment, the digital output signal is stored in a memory element, and this digital output signal is summed with the thermometer code produced on a subsequent clock cycle. In addition, the feedback signal is preferably an analog version of the prior digital output signal value stored in the memory element.

In each of the above embodiments, the analog input signal has a value within a first voltage range, and the analog-to-digital converter system and method performs analog to digital conversion on the analog input signal within the first voltage range. However, the plurality of comparators (or the step of comparing) operate to compare the analog input signal with the plurality of reference signals using a second voltage range which is less, typically substantially less, than the first voltage range. For example, the second voltage range used by the plurality of comparators may be less than one half, one fourth, or one eighth, or even less, than the first possible voltage range of the input analog signal.

Numerous additional variations and modifications will become apparent to those skilled in the art once the above disclosure is fully appreciated. It is intended that the following claims be interpreted to embrace all such variations and modifications.

What is claimed is:

1. An analog-to-digital converter, comprising:
   a first plurality of comparators each coupled to receive an analog input signal, wherein each comparator is further coupled to receive a respective comparator reference signal for comparison with the analog input signal, wherein the first plurality of comparators are each further configured to output a digital value indicative of the comparison of the analog input signal with the respective comparator reference signal;
   a decoder coupled to receive the outputs of the plurality of comparators, wherein the decoder is configured to output a digital signal representative of the analog input signal; and
   a dynamic reference controller coupled to the first plurality of comparators and the decoder, wherein the dynamic reference controller is configured to dynamically output one or more dynamic reference voltages to the first plurality of comparators, wherein the first plurality of comparators are operable to dynamically receive different comparator reference voltages for comparing with the analog input signal.

2. The analog-to-digital converter of claim 1, wherein the one or more dynamic reference voltages are output by the dynamic reference controller based on the digital signal representative of the analog input signal.

3. The analog-to-digital converter of claim 1, wherein the one or more dynamic reference voltages are output based on the analog input signal.

4. The analog-to-digital converter of claim 1, wherein the one or more dynamic reference voltages are output based on the analog input signal and the digital signal representative of the analog input signal.

5. The analog-to-digital converter of claim 1, wherein the dynamic reference controller is configured to dynamically output different one or more dynamic reference voltages such that analog input signal is within a range between a highest reference voltage and a lowest reference voltage.

6. The analog-to-digital converter of claim 1, wherein the dynamic reference controller is configured to dynamically output different dynamic reference voltages to allow for use of a reduced number of comparators in the first plurality of comparators, wherein a number of comparators in the first plurality of comparators is less than a number of bits in the digital signal representative of the analog input signal.

7. The analog-to-digital converter of claim 1, wherein the number of comparators is at least two less than the number of bits output by the analog-to-digital converter.

8. The analog-to-digital converter of claim 1, wherein the digital value indicative of the comparison of the analog input signal with the respective reference signal is a digital zero unless the analog input signal is greater than or equal to the respective reference signal in which case a digital one is output.

9. The analog-to-digital converter of claim 1, wherein the one or more dynamic reference voltages include a high reference voltage, wherein the dynamic reference controller is configured to dynamically output different high reference voltages to the first plurality of comparators.

10. The analog-to-digital converter of claim 9, wherein the one or more dynamic reference voltages further include a low reference voltage, wherein the dynamic reference controller is configured to dynamically output both the different high reference voltages and different low reference voltages to the first plurality of comparators.

11. The analog-to-digital converter of claim 1, further comprising:
   a plurality of latches coupled between the plurality of comparators and the decoder.

12. The analog-to-digital converter of claim 1, further comprising:
   a plurality of resistors coupled to the first plurality of comparators, wherein the plurality of resistors form a voltage divider tree, wherein the voltage divider tree is configured to provide said each comparator with the respective comparator reference signal.

13. The analog-to-digital converter of claim 1, wherein each of the plurality of resistors is variable, and wherein each of the plurality of resistors is operable to receive a control signal.

14. The analog-to-digital converter of claim 1, wherein the dynamic reference controller further comprises a memory operable to store a history of the reference voltages and the digital signal.

15. A method for performing analog-to-digital conversion, the method comprising:
   receiving an analog signal;
   comparing said analog signal with a plurality of reference signals to form a thermometer code representative of said analog signal;
   dynamically adjusting the plurality of reference signals used in said comparing;
   decoding said thermometer code to produce a decoding of said thermometer code; and
   adding a reference value corresponding to dynamic adjustments of the plurality of reference signals to the decoding of said thermometer code to produce a scaled digital decode of said thermometer code, wherein said scaled digital decode corresponds to said analog signal;
   wherein said dynamically adjusting the plurality of reference signals allows for use of a reduced number of comparators, wherein the reduced number of comparators is less than a number of bits in the scaled digital decode.

16. The method of claim 15, wherein the plurality of reference signals are dynamically adjusted based on the scaled digital decode.

17. The method of claim 15, wherein the plurality of reference signals are dynamically adjusted based on the analog signal.

18. The method of claim 15, wherein the plurality of reference signals are dynamically adjusted based on the scaled digital decode and the analog signal.

19. The method of claim 15, wherein said dynamically adjusting the plurality of reference signals includes dynamically outputting different reference voltages such that the analog signal is within a range between a highest reference voltage and a lowest reference voltage.

20. The method of claim 15, wherein the plurality of reference signals are dynamically adjusted by changing a high reference signal, wherein the high reference signal determines the upper bound of the plurality of reference signals.

21. The method of claim 20, wherein the plurality of reference signals are dynamically adjusted by changing the high reference signal and a low reference signal, wherein the high reference signal and the low reference signal determine the upper and lower bounds of the plurality of reference signals.

22. The method of claim 15, further comprising:
receiving a control signal operable to dynamically change the plurality of reference signals.

23. The method of claim 15, further comprising:
storing reference signals and scaled digital decodes in a memory, wherein said dynamically adjusting the plurality of reference signals used in said comparing uses said reference signals and scaled digital decodes stored in the memory.

24. An analog-to-digital converter, comprising:
a first plurality of comparators each coupled to receive a combined analog signal, wherein the combined analog signal includes an analog input signal and an analog feedback signal, wherein each comparator is further coupled to receive a respective reference signal for comparison with the combined analog signal, wherein the plurality of comparators are each further configured to output a digital value indicative of the comparison of the combined analog signal with the respective reference signal;
a digital summer coupled to receive the digital values output from the plurality of comparators, wherein the digital summer is configured to output a digital signal representative of the analog input signal;
a register coupled to receive and store the digital signal from the digital summer, wherein the register is further configured to output the stored digital signal corresponding to the analog input signal;
a digital-to-analog (D/A) converter coupled to receive the digital signal from the register, wherein the D/A converter is configured to generate the analog feedback signal in response to the digital signal;
wherein the digital summer is further coupled to receive the digital signal from the register, wherein the digital summer is further configured to combine the digital output with the outputs of the plurality of comparators to produce the digital signal, wherein the digital signal corresponds to the analog input signal.

25. The analog-to-digital converter of claim 24, wherein the plurality of comparators are operable to compare the combined analog signal with a first voltage range, wherein the analog-to-digital converter is operable to perform analog to digital conversion on the input analog signal having a second voltage range, wherein the first voltage range is less than the second voltage range.

26. The analog-to-digital converter of claim 24, wherein the plurality of comparators are operable to compare the combined analog signal with a first voltage range, wherein the analog-to-digital converter is operable to perform analog to digital conversion on the input analog signal having a second voltage range, wherein the first voltage range is substantially less than the second voltage range.

27. The analog-to-digital converter of claim 24, wherein the plurality of comparators are operable to compare the combined analog signal with a first voltage range, wherein the analog-to-digital converter is operable to perform analog to digital conversion on the input analog signal having a second voltage range, wherein the first voltage range is less than one half of the second voltage range.

28. The analog-to-digital converter of claim 24, further comprising:
a summing node coupled to receive the analog input signal and the analog feedback signal and to output the combined analog signal.

29. The analog-to-digital converter of claim 24, wherein the D/A converter includes a current generator for each of a plurality of bits in the digital signal, wherein each current generator is coupled to receive a respective bit of the digital signal.

30. A method for performing analog to digital conversion, the method comprising:
receiving an analog input signal;
subtracting a feedback signal from the analog input signal, thereby producing a combined analog signal;
comparing the combined analog signal with a plurality of reference signals to form a thermometer code representative of the combined analog signal;
summing the thermometer code with a digital value to generate a digital output signal wherein the digital output signal corresponds to the analog input signal;
wherein the analog input signal has a value within a first voltage range, wherein the method performs analog to digital conversion on the analog input signal within the first voltage range;
wherein said comparing operates to compare the combined analog signal with the plurality of reference signals using a second voltage range that is less than the first voltage range.

31. The method of claim 30, wherein the analog input signal has a value within a first voltage range, wherein the method performs analog to digital conversion on the analog input signal within the first voltage range;
wherein said comparing operates to compare the combined analog signal with the plurality of reference signals using a second voltage range that is less than one half of the first voltage range.

32. The method of claim 30, wherein the analog input signal has a value within a first voltage range, wherein the method performs analog to digital conversion on the analog input signal within the first voltage range;
wherein said comparing operates to compare the combined analog signal with the plurality of reference signals using a second voltage range that is less than one fourth of the first voltage range.

33. The method of claim 31, wherein the digital value comprises a prior value of the digital output signal.

34. The method of claim 30, further comprising:
generating the feedback signal based on the digital output signal.

35. The method of claim 34, wherein said generating the feedback signal comprises performing analog to digital conversion on the digital output signal to produce the feedback signal.

36. The method of 30, further comprising:

storing the digital output signal after said summing in a memory element;

wherein the digital value comprises a prior value of the digital output signal stored in the memory element.

37. The method of claim 36, further comprising:

generating the feedback signal, wherein said generating comprises performing analog to digital conversion on a prior value of the digital output signal stored in the memory element to produce the feedback signal.

38. An analog-to-digital converter, comprising:

a plurality of comparators each coupled to receive an analog input signal, wherein each comparator is further coupled to receive a respective comparator reference signal for comparison with the analog input signal, wherein the plurality of comparators are each further configured to output a digital value indicative of the comparison of the analog input signal with the respective comparator reference signal;

a decoder coupled to receive the outputs of the plurality of comparators, wherein the decoder is configured to output a digital signal representative of the analog input signal; and a dynamic reference controller coupled to the first plurality of comparators and the decoder, wherein the dynamic reference controller is configured to dynamically output one or more dynamic reference voltages to the first plurality of comparators, wherein the first plurality of comparators are operable to dynamically receive different comparator reference voltages for comparing with the analog input signal;

wherein the one or more dynamic reference voltages are output based on the analog input signal and the digital signal representative of the analog input signal.

39. An analog-to-digital converter, comprising:

a plurality of comparators each coupled to receive an analog input signal, wherein each comparator is further coupled to receive a respective comparator reference signal for comparison with the analog input signal, wherein the plurality of comparators are each further configured to output a digital value indicative of the comparison of the analog input signal with the respective comparator reference signal;

a decoder coupled to receive the outputs of the plurality of comparators, wherein the decoder is configured to output a digital signal representative of the analog input signal; and a dynamic reference controller coupled to the first plurality of comparators and the decoder, wherein the dynamic reference controller is configured to dynamically output one or more dynamic reference voltages to the first plurality of comparators, wherein the first plurality of comparators are operable to dynamically receive different comparator reference voltages for comparing with the analog input signal;

wherein the number of comparators is at least two less than the number of bits output by the analog-to-digital converter.

40. An analog-to-digital converter, comprising:

a plurality of comparators each coupled to receive an analog input signal, wherein each comparator is further coupled to receive a respective comparator reference signal for comparison with the analog input signal, wherein the plurality of comparators are each further configured to output a digital value indicative of the comparison of the analog input signal with the respective comparator reference signal;

a decoder coupled to receive the outputs of the plurality of comparators, wherein the decoder is configured to output a digital signal representative of the analog input signal; and a dynamic reference controller coupled to the first plurality of comparators and the decoder, wherein the dynamic reference controller is configured to dynamically output one or more dynamic reference voltages to the first plurality of comparators, wherein the first plurality of comparators are operable to dynamically receive different comparator reference voltages for comparing with the analog input signal;

wherein the one or more dynamic reference voltages include a high reference voltage, wherein the dynamic reference controller is configured to dynamically output different high reference voltages to the first plurality of comparators;

wherein the one or more dynamic reference voltages further include a low reference voltage, wherein the dynamic reference controller is configured to dynamically output both the different high reference voltages and different low reference voltages to the first plurality of comparators.

* * * * *